(12) United States Patent
Kishioka et al.

(10) Patent No.: US 7,425,403 B2
(45) Date of Patent: Sep. 16, 2008

(54) COMPOSITION FOR FORMING ANTI-REFLECTIVE COATING FOR USE IN LITHOGRAPHY

(75) Inventors: Takahiro Kishioka, Nei-gun (JP); Shinya Arase, Funabashi (JP); Ken-ichi Mizusawa, Nei-gun (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 11/444,392

(22) Filed: Jun. 1, 2006

(65) Prior Publication Data

US 2006/0216652 A1   Sep. 28, 2006

Related U.S. Application Data

(62) Division of application No. 10/472,695, filed as application No. PCT/JP02/03576 on Apr. 10, 2002, now Pat. No. 7,332,266.

(30) Foreign Application Priority Data

Apr. 10, 2001   (JP) .............................. 2001-111230

(51) Int. Cl.
 *G03F 7/11*   (2006.01)
 *G03F 7/40*   (2006.01)
(52) U.S. Cl. .................... 430/271.1; 430/313; 430/317; 430/318; 430/321; 430/323
(58) Field of Classification Search .................. None
See application file for complete search history.

(56) References Cited

U.S. PATENT DOCUMENTS

| 5,332,647 | A | 7/1994 | Ohno et al. |
| 5,693,691 | A | 12/1997 | Flaim et al. |
| 5,919,599 | A | 7/1999 | Meador et al. |
| 6,171,749 | B1 | 1/2001 | Tachikawa et al. |
| 2003/0180559 | A1 * | 9/2003 | Wayton et al. .............. 428/480 |

FOREIGN PATENT DOCUMENTS

| EP | 0 355 728 A2 | 2/1990 |
| JP | A 56-49548 | 5/1981 |
| JP | A 10-204110 | 8/1998 |
| JP | A 11-279523 | 10/1999 |

OTHER PUBLICATIONS

Wojtowicz, J.A., "Cyanuric and Isocyanuric Acids (Archive)", Kirk-Othmer Encyclopedia of Chemical Technology, Copyright 1993 (John Wiley & Sons, Inc.) article Online posing date Dec. 4, 2000, from sss.mrw.interscience.wiley.com, pp. 13 of 13 and 5 of 5.*

Derwent-Acc-No. 1981-45170D Derwent-Week: 198125 Copyright 2006 Derwent Information Ltd Abstract of JP 56049548 A publisrhed May 6, 1981.*

Lynch et al, "Properties and performance of near-UV reflectivity control layers (RCL)", Proceedings of SPIE—vol. 2195, Advances in Resist Technology and Processing X1, Omkaram Nalamasu, Ed, May 1994, pp. 225-235.*

Taylor et al, "Methacrylate resists and antireflective coatings for 193-nm lithography", Proceedings of SPIE—vol. 3678, Advances in Resist Technology and Processing XVI, Will Conley, ed, Jun. 1999, pp. 174-185.*

Tom Lynch et al.; "Properties and Performance of Near UV Reflectivity Control Unit"; SPIE, vol. 2195; pp. 225-229.

G. Taylor et al.; "Methacrylate Resists and Antireflective Coatings for 193 nm Lithography"; SPIE, vol. 3678, Mar. 1999; pp. 174-185.

XP-002280987.
XP-002281024.
XP-002281025.
XP-002281026.

* cited by examiner

*Primary Examiner*—Cynthia Hamilton
(74) *Attorney, Agent, or Firm*—Oliff & Berridge, PLC

(57) ABSTRACT

A composition for forming anti-reflective coating for use in a lithographic process in manufacture of a semiconductor device, comprising as a component a resin containing cyanuric acid or a derivative thereof, or a resin containing a structural unit derived from cyanuric acid or a derivative thereof. The structural unit is preferably represented by formula (1):

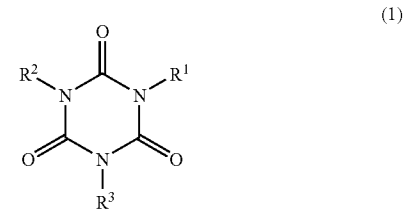

(1)

and can be contained in a main chain or a side chain, or both main chain and side chain of a resin. The anti-reflective coating for lithography obtained from the composition has a high reflection reducing effect and does not cause intermixing with a resist layer to give an excellent resist pattern. It has a higher selectivity in dry-etching compared with the resists.

6 Claims, No Drawings

COMPOSITION FOR FORMING ANTI-REFLECTIVE COATING FOR USE IN LITHOGRAPHY

This is a Division of application Ser. No. 10/472,695 filed Sep. 24, 2003, which in turn is a National Stage of PCT/JP02/03576 filed Apr. 10, 2002. The entire disclosure of the prior application is hereby incorporated by reference in its entirety.

TECHNICAL FIELD

The present invention relates to a composition for forming anti-reflective coating that is effective in lowering of adverse effects due to reflection off an underlying substrate in a lithographic process by using ArF excimer laser; and a method of forming a resist pattern by using the composition for forming anti-reflective coating.

BACKGROUND ART

Conventionally, in the manufacture of semiconductor devices, micro-processing by lithography using a photoresist composition has been carried out. The micro-processing is a processing method including forming a thin film of a photoresist composition on a silicon wafer, irradiating actinic rays such as ultraviolet rays via a mask pattern depicting a pattern for a semiconductor device, developing it to obtain a resist pattern, and etching the silicon wafer using the resist pattern as a protective film to form fine concavities and convexities corresponding to the pattern on the device. However, recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC).

As the anti-reflective coating, inorganic anti-reflective coatings made of titanium, titanium dioxide, titanium nitride, chromium oxide, carbon or α-silicon and organic anti-reflective coatings made of a light-absorbing substance and a high molecular compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group and a light absorbing group in the same molecule obtained by crosslinking reaction as disclosed in U.S. Pat. No. 5,919,599 and the novolak resin type anti-reflective coating having a hydroxyl group and a light absorbing group in the same molecule obtained by crosslinking reaction as disclosed in U.S. Pat. No. 5,693,691, and so on.

The physical properties required or desired for organic anti-reflective coating materials include high absorbance to light and radioactive rays, no intermixing with the resist layer (being insoluble in resist solvents), no diffusion of low molecular substances from the anti-reflective coating material into the topcoat resist upon coating or heat-drying, and a higher dry etching rate than the resist. They are described in, for example, Proc. SPIE, Vol. 3678, 174-185 (1999) and Proc. SPIE, Vol. 2195, 225-229 (1994).

On the other hand, Japanese Patent Laid-open No. 11-279523 describes a technique in which tris(hydroxyalkyl)isocyanurate substituted with an aromatic compound or an alicyclic compound is used as a UV absorbent covering a broad spectrum.

DISCLOSURE OF INVENTION

The present invention provides a composition for forming anti-reflecting coating that prevents effectively reflection particularly when an irradiating light with a wavelength of 193 nm is used for microfabrication, and that can be rapidly removed in removal process later, and that leads to a very useful anti-reflecting coating. That is, an object of the present invention is to provide a composition for forming an anti-reflective coating for lithography that has a high reflection-preventive effect, does not cause intermixing with a resist layer to give an excellent resist pattern and has a higher dry-etching rate compared with the resist; and a method of forming resist pattern by using the composition for forming anti-reflective coating.

In a first aspect, the present invention provides a composition for forming anti-reflective coating for use in a lithographic process in manufacture of a semiconductor device, comprising as a component a resin containing cyanuric acid or a derivative thereof, or a resin containing a structural unit derived from cyanuric acid or a derivative thereof.

In a second aspect, the present invention provides the composition as described in the first aspect, wherein the component contains cyanuric acid or a derivative thereof, represented by formula (1):

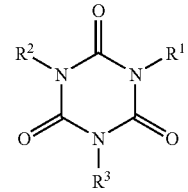

wherein $R^1$, $R^2$ and $R^3$ independently of one another are a hydrogen atom, a halogen atom, a substituted or unsubstituted alkyl group having 1 to 10 carbon atoms, a substituted or unsubstituted benzene derivative group, a substituted or unsubstituted vinyl derivative group or an epoxy derivative group.

In a third aspect, the present invention provides the composition as described in the first aspect, wherein the component is a resin containing in a main chain or a side chain the structural unit derived from the compound of formula (1), or a resin containing in both a main chain and a side chain the structural unit derived from the compound of formula (1).

In a fourth aspect, the present invention provides the composition as described in the second or third aspect, wherein the compound of formula (1) is tris(hydroxyalkyl)isocyanurate.

In a fifth aspect, the present invention provides the composition as described in any one of the first to fourth aspects, further comprising a crosslinking agent having at least two crosslink-forming functional groups.

In a sixth aspect, the present invention provides method of forming an anti-reflective coating for use in a lithographic process in a manufacture of a semiconductor device, comprising the steps of: coating the composition as described in any one of the first to fifth aspects on a substrate, and baking it.

In a seventh aspect, the present invention provides a process for manufacturing a semiconductor device comprising the steps of:

coating the composition according to any one of claims 1 to 5 on a substrate baking it to form an anti-reflective coating, covering the anti-reflective coating with a photoresist, exposing the substrate covered with the anti-reflective coating and the photoresist to light, developing the exposed substrate, and transferring an image on the substrate by etching to form an integrated circuit element.

BEST MODE FOR CARRYING OUT THE INVENTION

The present invention relates to a composition for forming anti-reflective coating for use in a lithographic process in the manufacture of a semiconductor device, comprising as a component a resin containing cyanuric acid or a derivative thereof, or a resin containing a structural unit derived from cyanuric acid or a derivative thereof.

The molecular weight of cyanuric acid or a derivative thereof used in the present invention ranges from 129 to 1,000, preferably from 129 to 600. In addition, the resin containing the structural unit derived from cyanuric acid or a derivative thereof may vary depending on the coating solvents used, the viscosity of the solvent, the shape of the coating, etc., and has a weight average molecular weight of 200 to 1,000,000, preferably 1,000 to 1,000,000.

The composition for forming anti-reflective coating according to the present invention contains 0.1 to 50% by weight of solids content. The content of the resin containing cyanuric acid or a derivative thereof, or a structural unit derived therefrom is 0.1 to 50 parts by weight, preferably 1 to 30 parts by weight based on 100 parts by weight of the total composition.

Cyanuric acid or a derivative thereof as a component exerts a reflection reducing effect by absorbing UV light, particularly UV light with a wavelength of 193 nm.

As cyanuric acid or a derivative thereof, compounds represented by formula (1) can be used. A composition for forming anti-reflecting coating can be obtained by mixing a component comprising cyanuric acid or a derivative thereof with a resin and dissolving them in a solvent. In addition, a composition for forming anti-reflecting coating can be obtained by dissolving a resin containing in a main chain or a side chain the structural unit derived from the compound of formula (1), or a resin containing in both a main chain and a side chain the structural unit derived from the compound of formula (1) in a solvent.

In the compounds of formula (1), $R^1$, $R^2$ and $R^3$ independently of one another are a hydrogen atom, a halogen atom, a substituted or unsubstituted alkyl group having 1 to 10 carbon atoms, a substituted or unsubstituted benzene derivative group, a substituted or unsubstituted vinyl derivative group or an epoxy derivative group. The halogen atom includes for example a fluorine atom, a chlorine atom, a bromine atom or a iodine atom. The alkyl group includes for example methyl, ethyl, propyl, isopropyl, n-butyl, isobutyl, sec-butyl, tert-butyl, n-pentyl, n-octyl or n-dodecyl. The benzene derivative group includes for example phenyl, benzyl, tolyl, methoxyphenyl, xylyl, biphenyl, naphthyl or anthryl. The vinyl derivative group includes for example ethenyl, propenyl, butenyl, butadienyl, hexenyl or octadienyl. The epoxy derivative group includes for example glycidyl or β-methyl-glycidyl.

These alkyl groups, benzene derivative groups and vinyl derivative groups may be unsubstituted or substituted, and the substituents include for example a halogen atom such as a chlorine atom, a bromine atom or a fluorine atom, a hydroxy group, an alkoxy group or an acyl group. Particularly preferable substituent is an hydroxy group.

The compounds of formula (1) includes tris(hydroxyalkyl) isocyanurate represented by formula (2):

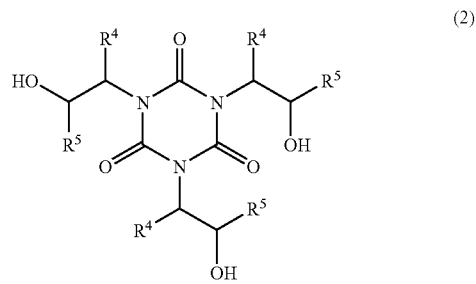

compounds represented by formula (3):

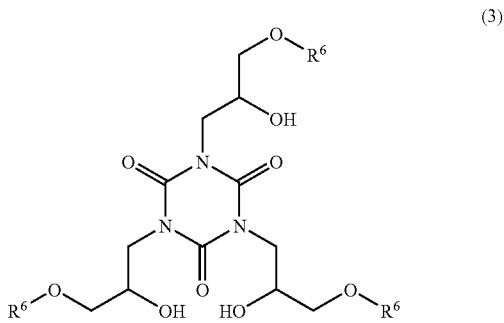

and compounds represented by formula (4):

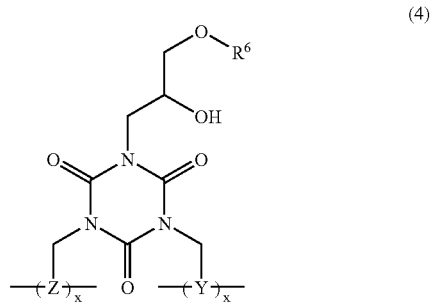

$R^4$ and $R^5$ in formula (2) are a hydrogen atom, an alkyl group having 1 to 12 carbon atoms, or an aromatic group having 6 to 14 carbon atoms such as phenyl, benzyl or tolyl. Preferable tris(hydroxyalkyl)isocyanurate includes for example tris(2-hydroxyethyl)isocyanurate, tris(2-hydroxypropyl)isocyanurate, tris(2-hydroxybutyl)isocyanurate or tris(α-methyl-β-hydroxypropyl)isocyanurate.

$R^6$ in formulae (3) and (4) is phenyl, benzyl, tolyl, methoxyphenyl, xylyl, biphenyl, naphthyl, anthryl or the like. In addition, x in formula (4) ranges from 1 to 1,000. Y and Z in formula (4) is

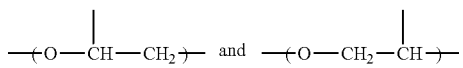

respectively. The compound of formula (4) can be produced by polymerizing tris(2,3-epoxypropyl)isocyanurate with phenol as raw materials, for example.

As the compound of formula (1), tris(hydroxyalkyl)isocyanurate represented by formula (2) is preferably used.

The compound of formula (1) can be used in the form of a mixture with a resin or in the form of a resin to which the compound is chemically bonded.

In the composition for forming anti-reflective coating according to the present invention, in case 1 where a resin is mixed with the compound of formula (1), the compound of formula (1) is bonded to the resin via a crosslinking agent or directly when an anti-reflective coating is formed by applying the composition on a substrate, and drying and baking it.

In the composition for forming anti-reflective coating according to the present invention, the compound of formula (1) may be contained in a resin added therein via a chemical bond. In such a case, the resin may contain a structural unit derived from the compound of formula (1) in its main chain or its side chain connecting to the main chain.

In case 2 where a resin contains a structural unit derived from the compound of formula (1) in its main chain, the resin is produced by polymerizing the compound of formula (1) as a monomer via a vinyl group or an epoxy group thereon. In case 3 where the compound of formula (1) is copolymerized with a monomer polymerizable therewith, the resin may contain the compound of formula (1) in its main chain.

In case 4 where a resin contains a structural unit derived from the compound of formula (1) in its side chain connecting to the main chain, the resin is produced by reacting a functional group (e.g., hydroxy group) on the compound of formula (1) with a functional group (e.g., hydroxy group or carboxyl group) on the resin to bond the compound of formula (1) with the resin.

Further, cases 1 to 4 may be combined one another.

In the above-mentioned case 2, a resin may be produced by using only the compound of formula (1). In the above-mentioned cases 1 to 4, the ratio of the compound of formula (1) to a resin can be adjusted to the compound of formula (1): a resin=1:99 to 99:1 in weight ratio. The dry-etching rate in anti-reflective coating is improved with an increase in the content of the compound of formula (1).

The resin that is used with the compound of formula (1) in cases 1 to 4 preferably has hydroxy group or carboxyl group in order to bind to a crosslinking agent.

The resin may be a homopolymer consisted of a monomer or a copolymer consisted of a plurality of monomers. The monomer includes the followings. Styrenes include for example polyhydroxy styrene, poly α-methyl styrene, poly p-methyl styrene, poly o-methyl styrene, poly p-methoxy styrene, poly p-chlorostyrene or polyvinyl benzoic acid. Acrylic or methacrylic acid or a derivative thereof includes for example carboxylic acids such as polyacrylic acid, polymethacrylic acid, polymaleic acid or polyfumaric acid, acrylic acid ester or methacrylic acid ester corresponding thereto, such as poly(methylacrylate), poly(ethylacrylate), poly(propylacrylate), poly(isopropylacrylate), poly(n-butylacrylate), poly(isobutylacrylate), poly(n-hexylacrylate), poly(octylacrylate), poly(2-ethylhexyl-acrylate), poly(laurylacrylate), poly(2-hydroxypropylacrylate) or poly(gycidylacrylate), amide or methacrylic acid amide, such as poly-acrylamide, poly-N-methylol acrylamide or polydiacetone acrylamide, or polyacrylonirile, polyvinyl chloride or polyethylvinyl ether. In particular, preferable resins are polyacrylic 2-hydroxypropyl having hydroxy group and mathacrylate corresponding thereto, and polyacrylic acid and polymethacrylic acid having carboxyl group.

The resin used in the present invention may be any of random copolymers, block copolymers and graft copolymers. The resin for forming the anti-reflective coating of the present invention can be synthesized by various methods such as radical polymerization, anionic polymerization or cationic polymerization. As the type of polymerization, various methods such as solution polymerization, suspension polymerization, emulsion polymerization or bulk polymerization are possible.

In the present invention, it is possible to copolymerize non-crosslinking monomers instead of the above-mentioned resins. This allows minute adjustment of dry-etching rate, reflectivity, etc. Such a copolymerizable monomer includes, for example, compounds having at least one addition polymerizable unsaturated bond selected from acrylic acid esters, acrylamides, methacrylic acid esters, methacrylamides, allyl compounds, vinyl ethers, vinyl esters, styrenes, crotonic acid esters, etc.

The acrylic acid esters include, for example, alkyl acrylates having 1 to 10 carbon atoms in the alkyl group.

The methacrylic acid esters include, for example, alkyl methacrylates having 1 to 10 carbon atoms in the alkyl group.

Acrylamides include, for example, acrylamide, N-alkylacrylamides, N-arylacrylamides, N,N-dialkylacrylamides, N,N-diarylacrylamides, N-methyl-N-phenylacrylamide, N-hydroxyethyl-N-methylacrylamide, N-2-acetamide ethyl-N-acetylacrylamide, etc.

Methacrylamides include, for example, methacrylamide, N-alkylmethacrylamides, N-arylmethacrylamides, N,N-dialkylmethacrylamides, N,N-diarylmethacrylamides, N-hydroxyethyl-N-methylmethacrylamide, N-methyl-N-phenylmethacrylamide, N-ethyl-N-phenylmethacrylamide, etc.

Vinyl ethers include, for example, alkyl vinyl ethers, vinyl aryl ethers, etc.

Vinyl esters include, for example, vinyl butyrate, vinyl isobutyrate, vinyl trimethylacetate, etc.

Styrenes include, for example, styrene, alkylstyrenes, alkoxystyrenes, halogenostyrenes, hydroxystyrene, carboxystyrene, etc.

Crotonic acid esters include, for example, alkyl crotonates such as butyl crotonate, hexyl crotonate, glycerine monocrotonate, etc.

Also, mention may be made of dialkyl itaconates, monoalkyl esters or dialkyl esters of maleic acid or fumaric acid, crotonic acid, itaconic acid, maleic anhydride, maleimide, acrylonitrile, methacrylonitrile, maleylonitrile, etc. In addition, generally, addition polymerizable unsaturated compounds which can copolymerize with the compounds of formula (1) as described above or resins to which the compounds are bonded may be used.

The anti-reflective coating forming composition of the present invention may contain a crosslinking agent having at least two crosslink-forming functional groups. The crosslinking agent includes, for example, melamines, substituted ureas, polymers having epoxy groups and the like. The agent is preferably methoxymethylated glycoluryl, methoxymethylated melamine or the like, more preferably tetramethoxymethyl glycoluryl or hexamethoxymethyl melamine. The addition amount of the crosslinking agent may vary depending on the coating solvents used, the underlying substrate used, the viscosity of the solvent required, the shape of the coating required, etc., and usually 0.001 to 20 parts by weight, preferably 0.01 to 10 parts by weight, more preferably 0.1 to 5.0 parts by weight based on 100 parts by weight of the total composition.

The anti-reflective coating forming composition of the present invention may contain further light absorbing agents, rheology controlling agents, adhesion auxiliaries, surfactants, etc. in addition to the above described ones, if necessary.

The rheology controlling agents are added mainly aiming at increasing the flowability of the anti-reflective coating forming composition and in particular in the baking step, increasing filling property of the anti-reflective coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 parts by weight based on 100 parts by weight of the total composition.

The adhesion auxiliaries are added mainly for the purpose of increasing the adhesion between the substrate or resist and the anti-reflective coating forming composition, in particular preventing the detachment of the resist in development. Specific examples thereof include chlorosilanes such as trimethylchlorosilane, dimethylvinylchlorosilane, methyldiphenylchlorosilane or chloromethyldimethyl-chlorosilane; alkoxysilanes such as trimethylmethoxysilane, dimethyldiethoxysilane, methyldimethoxysilane, dimethylvinylethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxy-silane or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiriaries are added in proportions of usually less than 5 parts by weight, preferably less than 2 parts by weight, based on 100 parts by weight of the total composition.

The anti-reflective coating forming composition of the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, etc., sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (DAINIPPON INK AND CHEMICALS, INC.), FLUORAD FC430, FC431 (SUMITOMO 3M LIMITED), ASAHI GUARD AG710, SURFLON S-382, SC101, SC102, SC103, SC104, SC105, SC106 (ASAHI GLASS CO., LTD.), organosiloxane polymer KP341 (SHINETSU CHEMICAL CO., LTD.), etc. The blending amount of the surfactants is usually 0.2 parts by weight or less, preferably 0.1 part by weight or less, based on 100 parts by weight of the total composition of the present invention. The surfactants may be added singly or two or more of them may be added in combination.

In the present invention, as the solvents for dissolving the above-described resin, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, cyclohexanone, etc. The organic solvents may be used singly or in combination of two or more of them.

Further, high boiling solvents such as propylene glycol monobutyl ether or propylene glycol monobutyl ether acetate may be mixed.

Among the solvents, propylene glycol monomethyl ether, propylene glycol monomethyl ether acetate, ethyl lactate, butyl lactate, and cyclohexanone are preferred for increasing the leveling property.

As the resist to be coated as an upper layer of the anti-reflective coating formed by using the composition of the present invention, any of negative type and positive type resists may be used and such a resist includes a positive type resist consisting of a novolak resin and 1,2-naphthoquinone diazide sulfonic acid ester, a chemically-amplified type resist which consists of a photo acid generator and a binder having a group which is decomposed with an acid and increases alkali dissolution speed, a chemically-amplified type resist consisting of an alkali-soluble binder, a photo acid generator, and a low molecular compound which is decomposed with an acid and increases the alkali dissolution speed of the resist, a chemically-amplified resist consisting of a photo acid generator, a binder having a group which is decomposed with an acid and increases the alkali dissolution speed, and a low molecular compound which is decomposed with an acid and increases the alkali dissolution speed of the resist.

As the developer for the above-mentioned positive type photoresist, use may be made of aqueous solutions of alkalis, e.g., inorganic alkalis such as sodium hydroxide, potassium hydroxide, sodium carbonate, sodium silicate, sodium metasilicate or aqueous ammonia, primary amines such as ethylamine or n-propylamine, secondary amines such as diethylamine or di-n-butylamine, tertiary amines such as triethylamine or methyldiethylamine, alcohol amines such as dimethylethanolamine or triethanolamine, quaternary ammonium salts such as tetramethylammonium hydroxide, tetraethylammonium hydroxide or choline, cyclic amines such as pyrrole or piperidine, etc. Furthermore, a suitable amount of an alcohol such as isopropyl alcohol or nonionic surfactant can be added to the aqueous solution of above-described alkalis. Among these, a preferred developer includes quaternary ammonium salts, more preferably tetramethylammonium hydroxide and choline.

Now, the method for forming resist patterns by using the composition for forming anti-reflective coating of the present invention will be described. On a substrate for use in the production of precision integrated circuit element (for example, transparent substrates such as silicon/silicon dioxide coat, glass substrate or ITO substrate), an anti-reflective coating forming composition is coated by a suitable coating method, for example, with a spinner, a coater or the like, and thereafter the substrate is baked to cure the composition to fabricate an anti-reflective coating. The film thickness of the anti-reflective coating is preferably 0.01 to 3.0 μm. The conditions of baking after the coating are 80 to 250° C. for 1 to 120 minutes. Then, a photoresist is coated, it is exposed to light through a predetermined mask, developed, rinsed and dried to obtain a good resist. If necessary, post exposure bake (PEB) may be performed.

EXAMPLES

Hereinafter, the present invention will be described based on examples but the present invention is not limited thereto.

Synthesis Example 1

Synthesis of Resin

After 90 g of 2-hydroxypropyl methacrylate was dissolved in 455 g of propylene glycol monomethyl ether, the reaction solution was warmed at 70° C. and simultaneously nitrogen gas was passed into the reaction solution. Thereafter, 0.9 g of azobisisobutyronitrile (manufactured by JUNSEI CHEMICAL CO., LTD.) was added as polymerization initiator and stirred under nitrogen atmosphere for 24 hours, and then 0.1 g of 4-methoxyphenol (manufactured by TOKYO KASEI KOGYO CO., LTD.) was added as polymerization terminator. The resulting resin was subjected to GPC analysis and as a result, its weight average molecular weight was found to be 71,300 in terms of standard polystyrene. The solids content in the solution was 20%.

Synthesis Example 2

Cresol novolak resin (manufactured by ASAHI CIBA CO., LTD., trade name ECN1299, weight average molecular weight: 3,900, the structure being shown by formula (5)) was provided.

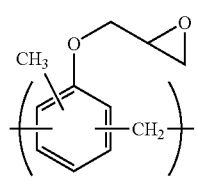

(5)

10 g of cresol novolak resin described above was added in 80 g of propylene glycol monomethyl ether and dissolved therein. To the solution, 9.7 g of 9-anthracenecarboxylic acid and 0.26 g of benzyltriethylammonium chloride were added. The resulting mixture was reacted at 105° C. for 24 hours. GPC analysis of the resulting polymer resin gave a weight average molecular weight of 5,600 in terms of standard polystyrene. The chemical structure of the resin is shown by formula (6).

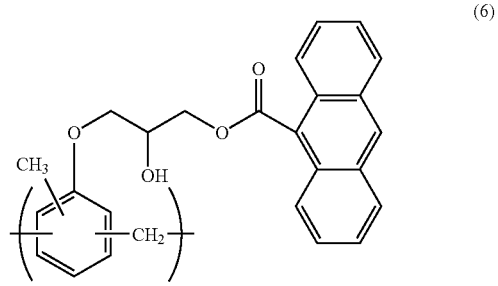

(6)

Synthesis Example 3

Tris-(2,3-epoxypropyl)-isocyanurate (manufactured by NISSAN CHEMICAL INDUSTRIES, LTD., trade name TEPIC, the structure being shown by formula (7)) was provided.

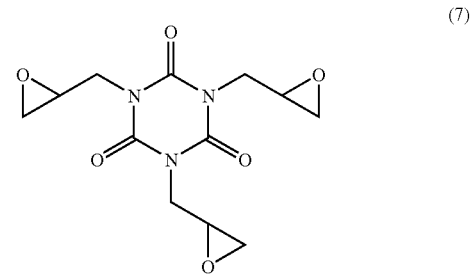

(7)

3.0 g of the above-mentioned tris-(2,3-epoxypropyl)-isocyanurate was added and dissolved in 7.0 g of xylene. Then 2.8 g of phenol and 0.17 g of benzyl triethyl ammonium chloride were added to the dissolved solution, and thereafter reacted at 140° C. for 24 hours. After the reaction was completed, the reaction solution was gradually cooled, crystals separated out were filtered, and then purified by recrystallization from a mixed solvent of isopropylalcohol/acetone=9/1. The chemical structure of the resulting compound is shown by formula (8).

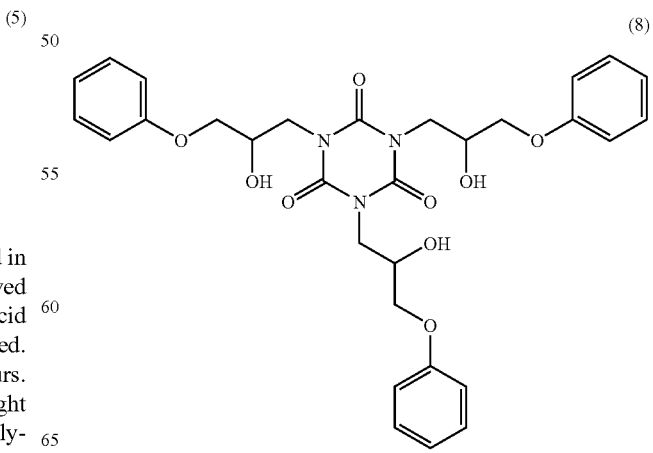

(8)

Synthesis Example 4

10.0 g of tris-(2,3-epoxypropyl)-isocyanurate was added and dissolved to 24.0 g of xylene. After adding 3.2 g of phenol and 0.57 g of benzyl triethyl ammonium chloride to the dissolved solution, reaction was carried out at 140° C. for 24 hours. After the reaction was completed, the reaction solution was gradually cooled, polymers separated out were filtered, washed with xylene and dried. The chemical structure of the resulting polymer compound is shown by formula (9). The polymer has a weight average molecular weight of 3,000.

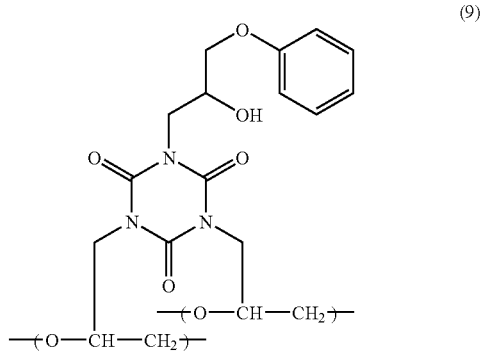

(9)

Synthesis Example 5

Tris(2-hydroxyethyl)isocyanurate (manufactured by NISSAN CHEMICAL INDUSTRIES, LTD., trade name TANAC, the structure being shown by formula (10)) was provided.

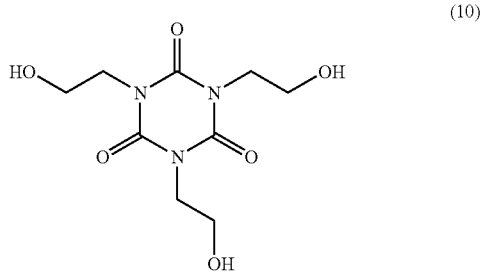

(10)

Example 1

0.4 g of tris(2-hydroxyethyl)isocyanurate, 6 g of a reaction solution containing 1.2 g of poly2-hydroxypropylmethacrylate obtained in Synthesis Example 1, 0.4 g of hexamethoxymethylmelamine as a crosslinking agent, and 0.04 g of p-toluenesulfonic acid as a hardening agent were mixed, and to the mixture 30 g of propylene glycol monomethyl ether was added as a solvent. Then, the solution was filtered through a micro filter made of polyethylene having a pore diameter of 0.10 μm, and then, the solution was filtered through a micro filter having a pore diameter of 0.05 μm, to prepare an anti-reflective coating composition in the state of solution. The solution was coated on a silicon wafer using a spinner and the wafer was heated at 205° C. for 1 minute on a hot plate to form an anti-reflective coating (film thickness: 0.08 μm). Measurement of the anti-reflective coating by a spectral ellipsometer indicated a refractive index n of 1.76 and optical extinction coefficient k of 0.11 at 193 nm.

Example 2

0.8 g of tris(2-hydroxyethyl)isocyanurate, 4 g of a reaction solution containing 0.8 g of poly2-hydroxypropylmethacrylate obtained in Synthesis Example 1, 0.4 g of hexamethoxymethylmelamine as a crosslinking agent, and 0.04 g of p-toluenesulfonic acid as a hardening agent were mixed, and to the mixture 30 g of propylene glycol monomethyl ether was added as a solvent. Then, the solution was filtered through a micro filter made of polyethylene having a pore diameter of 0.10 μm, and then, the solution was filtered through a micro filter having a pore diameter of 0.05 μm, to prepare an anti-reflective coating composition in the state of solution. The solution was coated on a silicon wafer using a spinner and the wafer was heated at 205° C. for 1 minute on a hot plate to form an anti-reflective coating (film thickness: 0.08 μm). Measurement of the anti-reflective coating by a spectral ellipsometer indicated a refractive index n of 1.76 and optical extinction coefficient k of 0.17 at 193 nm.

Example 3

1.2 g of tris(2-hydroxyethyl)isocyanurate, 2 g of a reaction solution containing 0.4 g of poly2-hydroxypropylmethacrylate obtained in Synthesis Example 1, 0.4 g of hexamethoxymethylmelamine as a crosslinking agent, and 0.04 g of p-toluenesulfonic acid as a hardening agent were mixed, and to the mixture 30 g of propylene glycol monomethyl ether was added as a solvent. Then, the solution was filtered through a micro filter made of polyethylene having a pore diameter of 0.10 μm, and then, the solution was filtered through a micro filter having a pore diameter of 0.05 μm, to prepare an anti-reflective coating composition in the state of solution. The solution was coated on a silicon wafer using a spinner and the wafer was heated at 205° C. for 1 minute on a hot plate to form an anti-reflective coating (film thickness: 0.08 μm). Measurement of the anti-reflective coating by a spectral ellipsometer indicated a refractive index n of 1.87 and optical extinction coefficient k of 0.23 at 193 nm.

Example 4

4.0 g of a reaction solution containing 0.8 g of poly2-hydroxypropyl-methacrylate resin obtained in Synthesis Example 1 was mixed with 0.8 g of the compound obtained in Synthesis Example 3, 0.4 g of hexamethoxymethylmelamine as a crosslinking agent and 0.04 g of p-toluenesulfonic acid as a hardening agent and to the mixture 35 g of ethyl lactate was added as a solvent. Then, the solution was filtered through a micro filter made of polyethylene having a pore diameter of 0.10 μm, and then, the solution was filtered through a micro filter having a pore diameter of 0.05 μm, to prepare an anti-reflective coating composition in the state of solution. The solution was coated on a silicon wafer using a spinner and the wafer was heated at 205° C. for 1 minute on a hot plate to form an anti-reflective coating (film thickness: 0.08 μm). Measurement of the anti-reflective coating by a spectral ellipsometer indicated a refractive index n of 1.80 and optical extinction coefficient k of 0.38 at 193 nm.

Example 5

1.6 g of the compound obtained in Synthesis Example 4 was mixed with 0.4 g of hexamethoxymethylmelamine as a crosslinking agent and 0.04 g of p-toluenesulfonic acid as a hardening agent and to the mixture 35 g of ethyl lactate was added as a solvent. Then, the solution was filtered through a micro filter made of polyethylene having a pore diameter of 0.10 μm, and then, the solution was filtered through a micro filter having a pore diameter of 0.05 μm, to prepare an antireflective coating composition in the state of solution. The solution was coated on a silicon wafer using a spinner and the wafer was heated at 205° C. for 1 minute on a hot plate to form an anti-reflective coating (film thickness: 0.08 µm). Measurement of the anti-reflective coating by a spectral ellipsometer indicated a refractive index n of 1.96 and optical extinction coefficient k of 0.65 at 193 nm.

Comparative Example 1

10 g of a solution containing 2 g of the resin obtained in Synthesis Example 2 above was mixed with 0.53 g of hexamethoxymethyl melamine as a crosslinking agent and 0.05 g of p-toluenesulfonic acid monohydrate as a hardening agent and the mixture was dissolved in 14.3 g of ethyl lactate, 1.13 g of propylene glycol monomethyl ether, and 2.61 g of cyclohexanone as solvents to form a 9% solution. Then, the solution was filtered through a micro filter made of polyethylene having a pore diameter of 0.10 µm, and then, the solution was filtered through a micro filter having a pore diameter of 0.05 µm, to prepare an anti-reflective coating forming composition. The solution was coated on a silicon wafer using a spinner and the wafer was heated at 205° C. for 1 minute on a hot plate to form an anti-reflective coating (film thickness: 0.23 µm). Measurement of the anti-reflective coating by a spectral ellipsometer indicated a refractive index n of 1.60 and optical extinction coefficient k of 0.47 at 193 nm.

Test Example 1

The solutions obtained in Examples 1 to 5 and Comparative Example 1 were coated on silicon wafers by means of a spinner. The coated silicon wafers were heated at 205° C. for 1 minute on a hot plate to form anti-reflective coatings (film thickness 0.23 µm). The anti-reflective coatings were dipped in a solvent used for resists, for example, ethyl lactate and propylene glycol monomethyl ether and as a result it was confirmed that they were insoluble in these solvents.

The solutions obtained in Examples 1 to 5 and Comparative Example 1 were coated on silicon wafers by means of a spinner. The coated silicon wafers were heated at 205° C. for 1 minute on a hot plate to form anti-reflective coatings (film thickness 0.23 µm) and their film thicknesses were measured. On each anti-reflective coating for lithography was coated a commercially available resist solution (manufactured by SUMITOMO CHEMICAL CO., LTD., trade name: PAR710, etc.) by means of a spinner. The coated wafers were heated at 130° C. for 1 minute on a hot plate. After exposure of the resists to light, post exposure baking was performed at 130° C. for 1.5 minutes. After developing the resists, the film thicknesses of the anti-reflective coatings were measured and as a result it was confirmed that no intermixing occurred between the anti-reflective coatings for lithography obtained in Examples 1 to 3 and Comparative Example 1 and the resist layers.

Dry-etching was carries out for the above-obtained anti-reflective coatings under the same condition. Selectivity in dry-etching means the dry-etching rate of an anti-reflective coating when the dry-etching rate of the photoresist was set at 1.00.

TABLE 1

|  | Refractive index (n) | Optical extinction coefficient (k) | Selectivity in dry-etching |
| --- | --- | --- | --- |
| Example 1 | 1.76 | 0.11 | 1.64 |
| Example 2 | 1.76 | 0.17 | 1.83 |
| Example 3 | 1.87 | 0.23 | 2.16 |
| Example 4 | 1.80 | 0.38 | 1.47 |

TABLE 1-continued

|  | Refractive index (n) | Optical extinction coefficient (k) | Selectivity in dry-etching |
| --- | --- | --- | --- |
| Example 5 | 1.96 | 0.65 | 1.48 |
| Comparative Example 1 | 1.60 | 0.47 | 0.88 |

The gas composition for dry-etching was $CF_4$. The etching characteristics of the anti-reflective coating obtained from the composition for forming anti-reflective coating of Example 1 were higher than those of the prior anti-reflective coating of Comparative Example 1. Particularly, it was confirmed from Example 3 that etching rate was increased with an increase in the content of cyanuric acid derivative.

From the following, it is required that the dry-etching rate of an anti-reflective coating is higher than that of a photoresist: In the process of developing a photoresist formed on an anti-reflective coating and then exposing an underlying substrate by dry-etching, the dry-etching of the anti-reflective coating progresses faster than that of the photoresist, thereby decrease of the photoresist is suppressed and the anti-reflective coating is effectively removed. Therefore, the pattern on developed photoresist can be precisely transferred on the substrate. Consequently, the composition for forming an anti-reflective coating of the present invention is very effective because it provides an anti-reflective with practical reflective index and optical extinction coefficient and for holding a high dry-etching rate. In particular, among the compounds of formula (1), tris(hydroxyalkyl)isocyanurate that has no functional group, such as phenyl group or alicyclic structure in its molecule is very effective because it induces a high dry-etching rate.

INDUSTRIAL APPLICABILITY

The present invention provides compositions from which anti-reflective coatings with high dry-etching rate can be formed. The obtained anti-reflective coatings are not only excellent in reflection reducing effect but also able to be rapidly removed in a dry-etching process of an underlying substrate.

The present invention can provide a composition for forming an anti-reflective coating which has a higher dry-etching rate than resists, and a high reflection reducing effect, causes no intermixing with a resist layer and has no diffusing material into a resist in the heating and drying process to give an anti-reflective coating with a high resolution and an excellent dependency on thickness of resist. Further, the composition can form an excellent resist pattern on a substrate.

What is claimed is:

1. A method of forming an anti-reflective coating for use in a lithographic process in a manufacture of a semiconductor device, comprising:

coating a composition comprising as a component a resin containing tris(hydroxyalkyl)isocyanurate on a substrate;

baking the coated substrate to form the anti-reflective coating; and covering the anti-reflective coating with a photoresist, wherein the anti-reflective coating has a higher dry-etching rate than the photoresist.

2. The method of claim 1, wherein the component is a resin containing in a main chain or a side chain a structural unit derived from tris (hydroxyalkyl)isocyanurate, or a resin containing in both a main chain and a side chain the structural unit derived from tris(hydroxyalkyl)isocyanurate.

3. The method of claim 1, wherein the composition further comprises a crosslinking agent having at least two crosslink-forming functional groups.

4. A process for manufacturing a semiconductor device comprising:
   coating a composition comprising as a component a resin containing tris(hydroxyalkyl)isocyanurate;
   baking the coated substrate to form an anti-reflective coating;
   covering the anti-reflective coating with a photoresist;
   exposing the substrate covered with the anti-reflective coating and the photoresist to light;
   developing the exposed substrate; and
   transferring an image on the substrate by etching to form an integrated circuit element,
   wherein the anti-reflective coating has a higher dry-etching rate than the photoresist.

5. The process of claim 4, wherein the component is a resin containing in a main chain or a side chain a structural unit derived from tris(hydroxyalkyl)isocyanurate, or a resin containing in both a main chain and a side chain the structural unit derived from tris(hydroxyalkyl)isocyanurate.

6. The process of claim 4, wherein the composition further comprises a crosslinking agent having at least two crosslink-forming functional groups.

* * * * *